(12) United States Patent
Jensen et al.

(10) Patent No.: US 6,621,000 B2
(45) Date of Patent: Sep. 16, 2003

(54) PERFORATED EMI GASKET

(75) Inventors: Ralph W. Jensen, Austin, TX (US); Richard S. Mills, Austin, TX (US); Jeffrey C. Hailey, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 102 days.

(21) Appl. No.: 09/934,279

(22) Filed: Aug. 21, 2001

(65) Prior Publication Data

US 2003/0037943 A1 Feb. 27, 2003

(51) Int. Cl.[7] .................................................. H05K 9/00
(52) U.S. Cl. .................. 174/35 GC; 361/816; 361/818; 174/35 R
(58) Field of Search .................. 174/35 GC, 35 R, 174/52.1, 51; 361/816, 818, 600, 601, 627, 679, 683, 684; 455/347

(56) References Cited

U.S. PATENT DOCUMENTS

| | | | | |
|---|---|---|---|---|
| 4,857,668 A | | 8/1989 | Buonanno | 174/35 GC |
| 4,873,394 A | * | 10/1989 | Bhargava et al. | 174/35 R |
| 5,204,496 A | * | 4/1993 | Boulay et al. | 174/35 GC |
| 5,351,176 A | * | 9/1994 | Smith et al. | 361/681 |
| 5,774,330 A | * | 6/1998 | Melton et al. | 361/683 |
| 5,975,953 A | * | 11/1999 | Peterson | 439/607 |
| 6,349,042 B1 | * | 2/2002 | Mills et al. | 361/818 |

* cited by examiner

Primary Examiner—Dean A. Reichard
Assistant Examiner—W. David Walkenhorst
(74) Attorney, Agent, or Firm—Haynes and Boone, LLP

(57) ABSTRACT

A computer chassis includes a first metal portion and a second metal portion. A mating edge connection is provided between the first and second portions. A gasket is mounted in the edge connection. The gasket includes a compressible strip of electromagnetic interference (EMI) limiting material. A pattern of holes is formed in the strip to improve compressibility and thus enhance EMI shielding.

7 Claims, 9 Drawing Sheets

GASKET COMPRESSION CURVES
MODIFIED AND UNMODIFIED CHOMERICS-74011

| POINTS | REGULAR RESISTANCE (MILLIOHMS-FT) | PERFED RESISTANCE (MILLIOHMS-FT) |
|---|---|---|
| A | 53.1 | |
| B | 9.0 | 18.4 |
| C | 3.9 | 9.7 |
| D | 2.7 | 7.1 |
| E | 2.0 | 3.4 |
| F | 1.7 | 2.6 |
| G | 1.5 | 2.0 |
| H | 1.4 | 1.5 |
| I | 1.4 | 1.3 |
| J | 1.5 | 1.3 |

PERFORATED EMI GASKET

BACKGROUND

The disclosures herein relate generally to computer systems and more particularly to a perforated gasket for providing an electromagnetic interference seal for a computer chassis enclosure.

There is a widespread problem of trying to close, or fill, gaps in chassis enclosures, especially removable-cover seams. The ability to close these gaps is essential in order to pass the FCC's electromagnetic interference (EMI) requirement and well as electrostatic discharge susceptibility.

Conductive foam gaskets have proven to be the most robust and cost effective solution to providing an EMI seal. However, traditional foam gaskets pose a number of problems.

The bigger/taller the gasket profile, or cross-section, the greater it's range of compression. However, the problem is further complicated by cover and chassis geometry. Firstly, a foam gasket is selected that, theoretically, gives the required range of compression, given the theoretical tolerances (and theoretical forces). But if this gasket generates forces, which either deform the covers so subsequent gaps are created, or the net forces are too high for ergonomic requirements, then a larger gasket is selected that generates less force for a given range of compression. Most often, both tolerances and actual forces contribute to the problem, invariably due to design changes and variance in the parts throughout the product design/development cycles. However the chassis design must be revised to accommodate the larger volume gasket, if possible. Often the space is simply not available. In thin rack servers this is the case because the residual height of the gasket after maximum allowable compression must be accommodated and that space is not available. When engineers initially "pad" their designs with excessive gasket volumes, the computer designs as a whole will be subsequently degraded from lost volume or other geometric/space conflicts. Whole programs maybe abandoned or disabled due to this practice. Therefore, any solution that incrementally reduces the compressive forces relative to range of compression for a gasket helps tremendously.

Two other solutions are commonly used to solve the above problems; custom spring fingers and wire mesh gaskets. Custom spring fingers are far more expensive (if made from Beryllium Copper or Phosbronze) or not as resilient as foam core gaskets. Additionally, spring fingers are not as robust in terms of customer access as they can easily hang up on passing objects, getting permanently deformed or broken off. Wire mesh gaskets have an inherent problem with having to be sealed at their ends to prevent unraveling. This causes the ends to be too stiff, thereby countering the high compliance given by the middle sections. Also, there is much more difficulty in adhering them to the covers or chassis as there are no continuous surfaces to apply a contact adhesive. This lack of continuous contact surfaces also causes the wire mesh to be of less value in term of radio frequency (RF) attenuation or electrostatic discharge (ESD) conductivity.

Chassis designers face another general problem concerning gap closure; non-uniform distortion of covers. Parts deflections under load (aside from coil springs) produce various complex deflection curves. This deflection curve, all too often, causes covers to bow away from the chassis to the point where a gap develops along the seam. Even a minuscule gap of a few thousandths of an inch can cause the computer to fail EMI or ESD requirements.

An additional problem encountered is that a linear gasket provides a force/unit length proportional to the compression in the same unit length. In many cases, the compression is severely uneven over the length that the gasket is being used. For example, on a hinged door with a latch on the outside edge, there would be much more compression (and more force) toward the hinge and toward the latch than there would be in the center of the door. Using a standard gasket tends to deform such a door, and potentially does not provide enough force to electrically seal the door in the center. What is ideally needed is a gasket that provides a varying force-compression curve along its length. Again, in the case of a latched door, it would provide more force in the center, and less toward the hinge and latch, optimally providing a constant force per unit length while the door is closed and latched.

Therefore, what is needed is a gasket that provides EMI shielding and generates less force than a traditional gasket, and that has the ability to vary the force provided along the length of the gasket.

SUMMARY

One embodiment, accordingly, provides an EMI shielding gasket which reduces the closure force between the chassis closure surfaces and provides enhanced EMI shielding. To this end, a gasket includes a compressible strip of EMI limiting material. A pattern of apertures is formed in the strip.

A principal advantage of this embodiment is that a more consistent linear sealing force is provided along the seam between the chassis closure surfaces.

DETAILED DESCRIPTION

Figure 1:
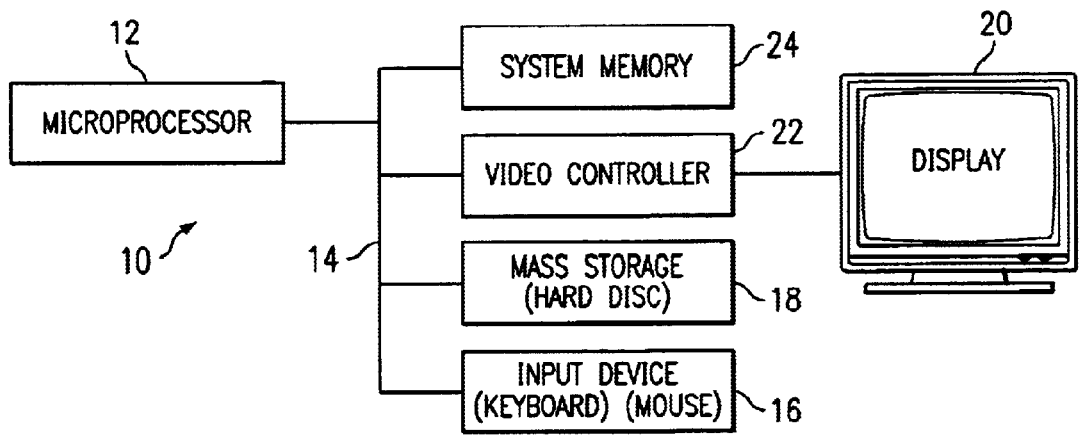
FIG. 1 a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
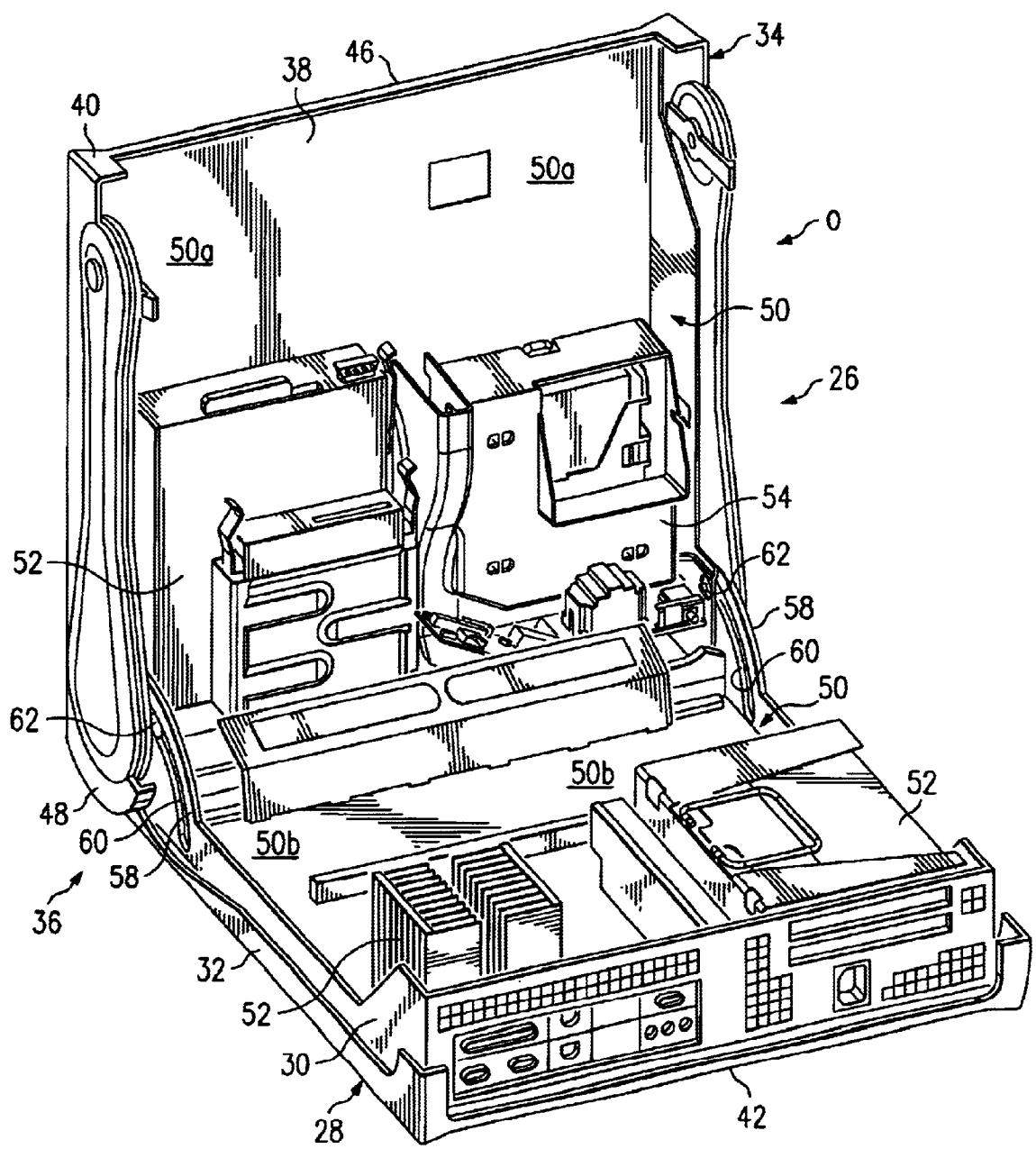
FIG. 2 is perspective view illustrating an embodiment of a chassis in an open position.

A chassis 26, FIG. 2, is provided to support all or most of the components of system 10, as set forth above. Chassis 26 includes a base portion 28 formed of a metal portion 30 and a cosmetic cover 32. A top portion 34 of chassis 26 is pivotally connected to base portion 28 at a hinge connection generally designated 36. Top portion 34 includes a metal portion 38 and a cosmetic cover 40. The base portion 28 includes a base surface 42. The cosmetic cover 40 includes a top surface 46 and an endwall 48. The base portion 28 forms part of a cavity 50 in chassis 26 for containing a plurality of first computer components 52, and the top portion 34 forms another part of the cavity 50 for containing a plurality of second computer components 54.

Figure 3:
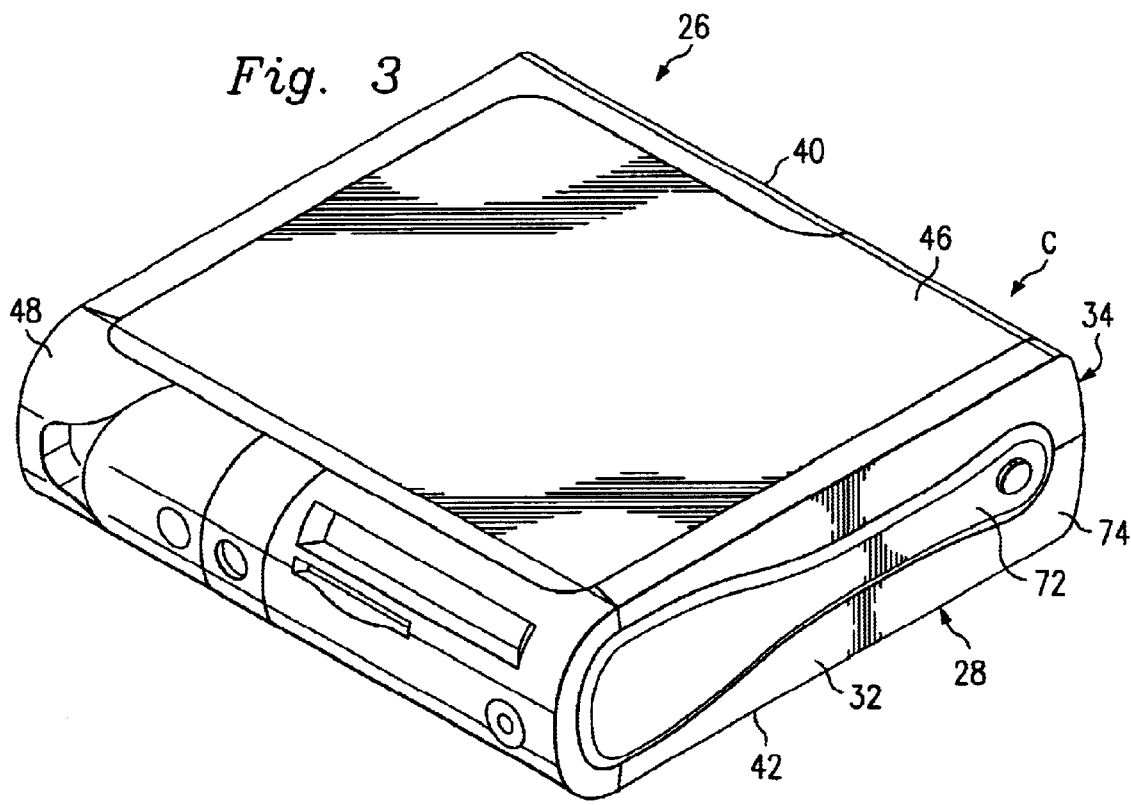
FIG. 3 is a perspective view illustrating the chassis in a closed position.

The hinge connection 36 permits the top portion 34 to pivot to an open position 0 about 90° relative to base portion 28, and to pivot to a closed position C, FIG. 3, wherein the top portion 34 and base portion nest together to define the cavity 50. It is understood that the open position 0 may be more or less than 90° as desired.

Figure 4:
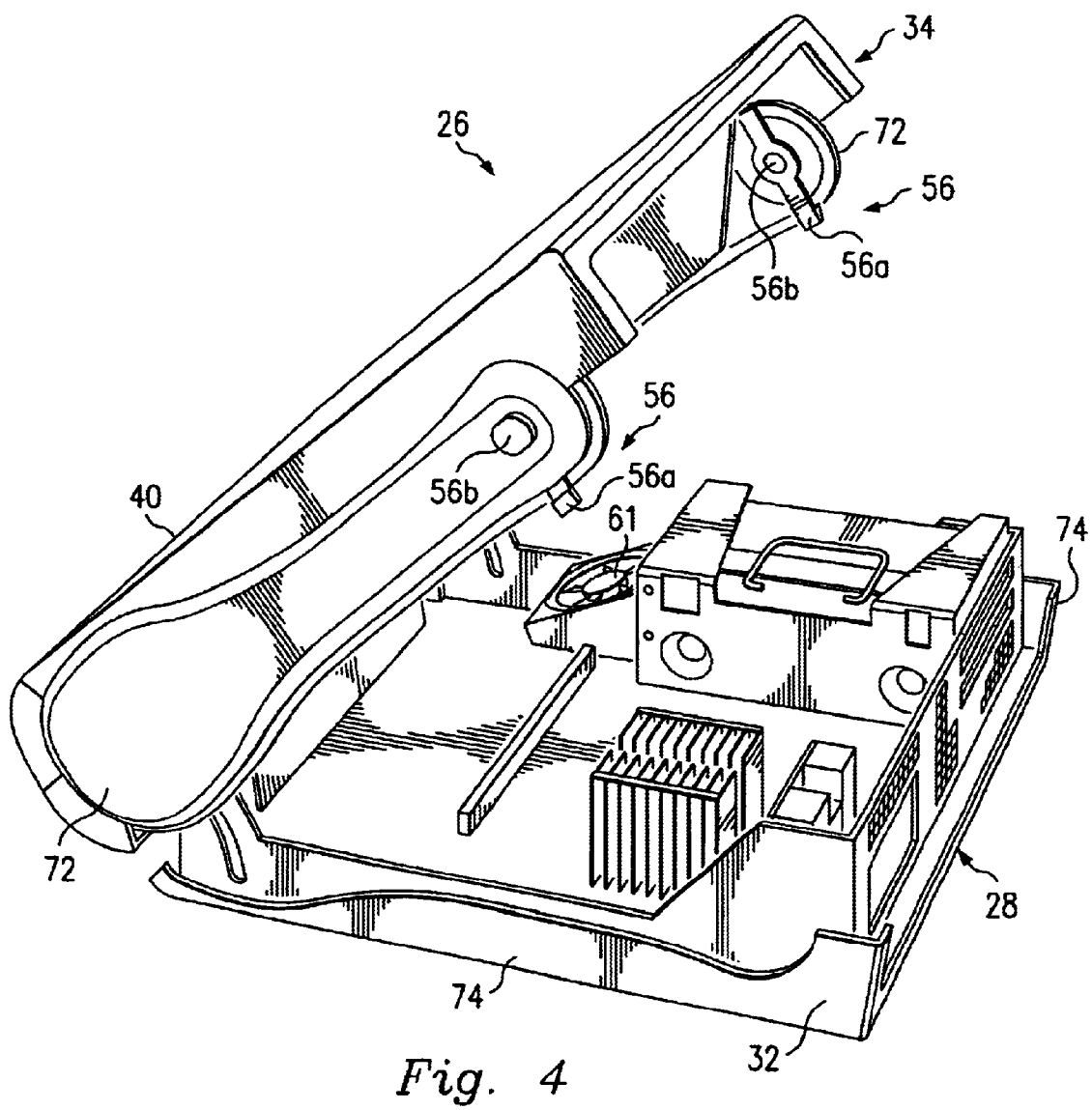
FIG. 4 is another perspective view illustrating the chassis in the open position.

A pair of side panels 72, FIGS. 3 and 4, of top cosmetic cover 40 are configured to nest with a complimentary configured pair of side panels 74 of base cosmetic cover 32 when chassis 26 is in the closed position C. When closed, the top portion 34 is automatically secured to the base portion 28 by a releasable latch 56, extending from each side panel 72 of top portion 34, which includes a latch member 56a and a release button 56b which permits latch member 56a to disengage from base portion 28.

Pivotal movement of top portion 34, FIG. 2, relative to base portion 28 is assisted by the hinge connection 36 including a pair of arcuate guides 58 attached to base portion 28. A groove 60 in guides 58 receives a pin 62 attached to top portion 34 for sliding movement in guides 58.

Figure 5:
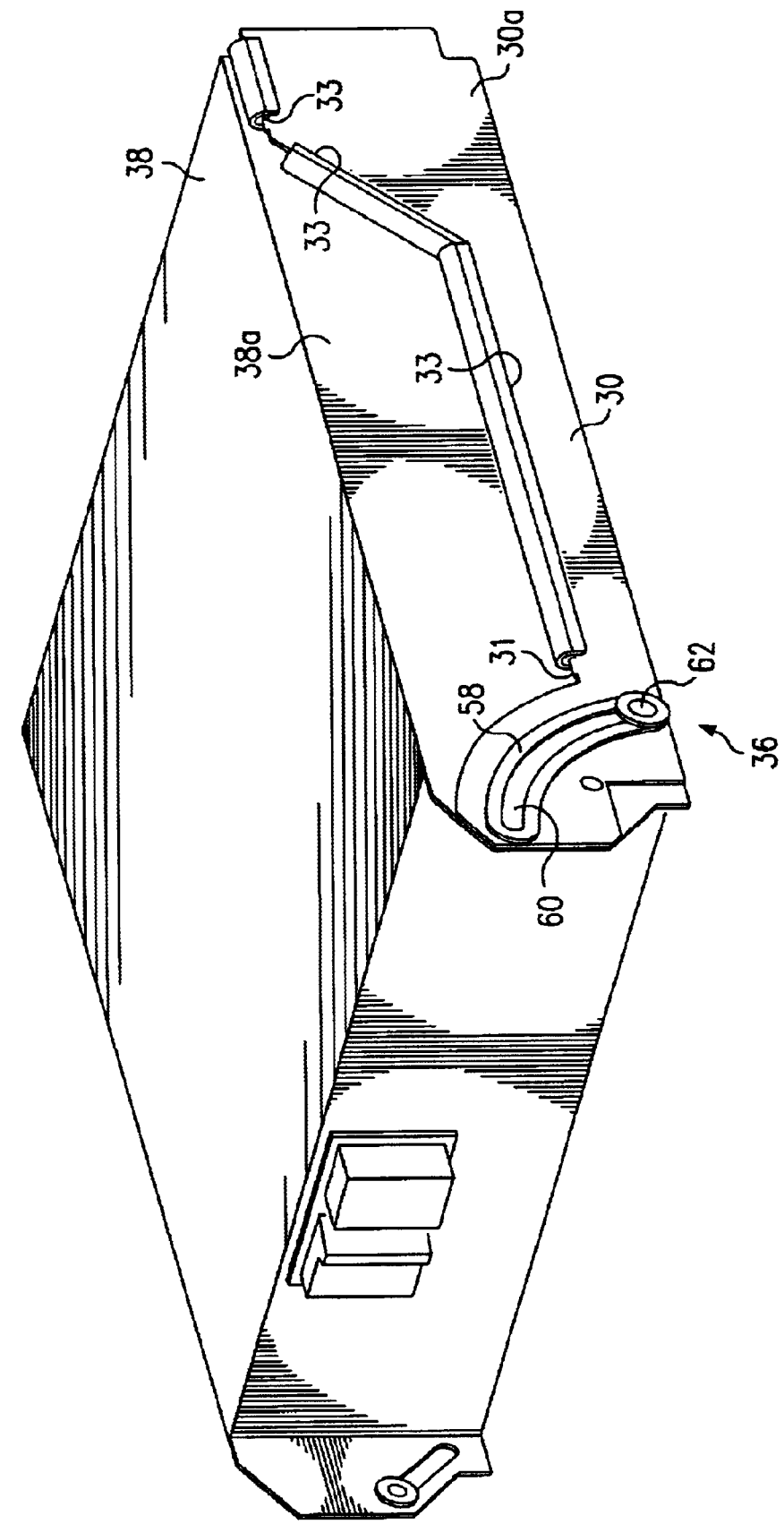
FIG. 5 is a further perspective view illustrating the chassis in the closed position.

In FIG. 5, the metal chassis is illustrated including the metal base portion 30 and the metal top portion 38. The hinge 36 is also illustrated including one of the arcuate guides 58, including groove 60, in the metal base portion 30, and one of the pins 62 attached to the metal top portion 38. This enables the top metal portion 38 to pivot relative to the base metal portion 30 between the open position O and the closed position C, as described above.

Figure 6:
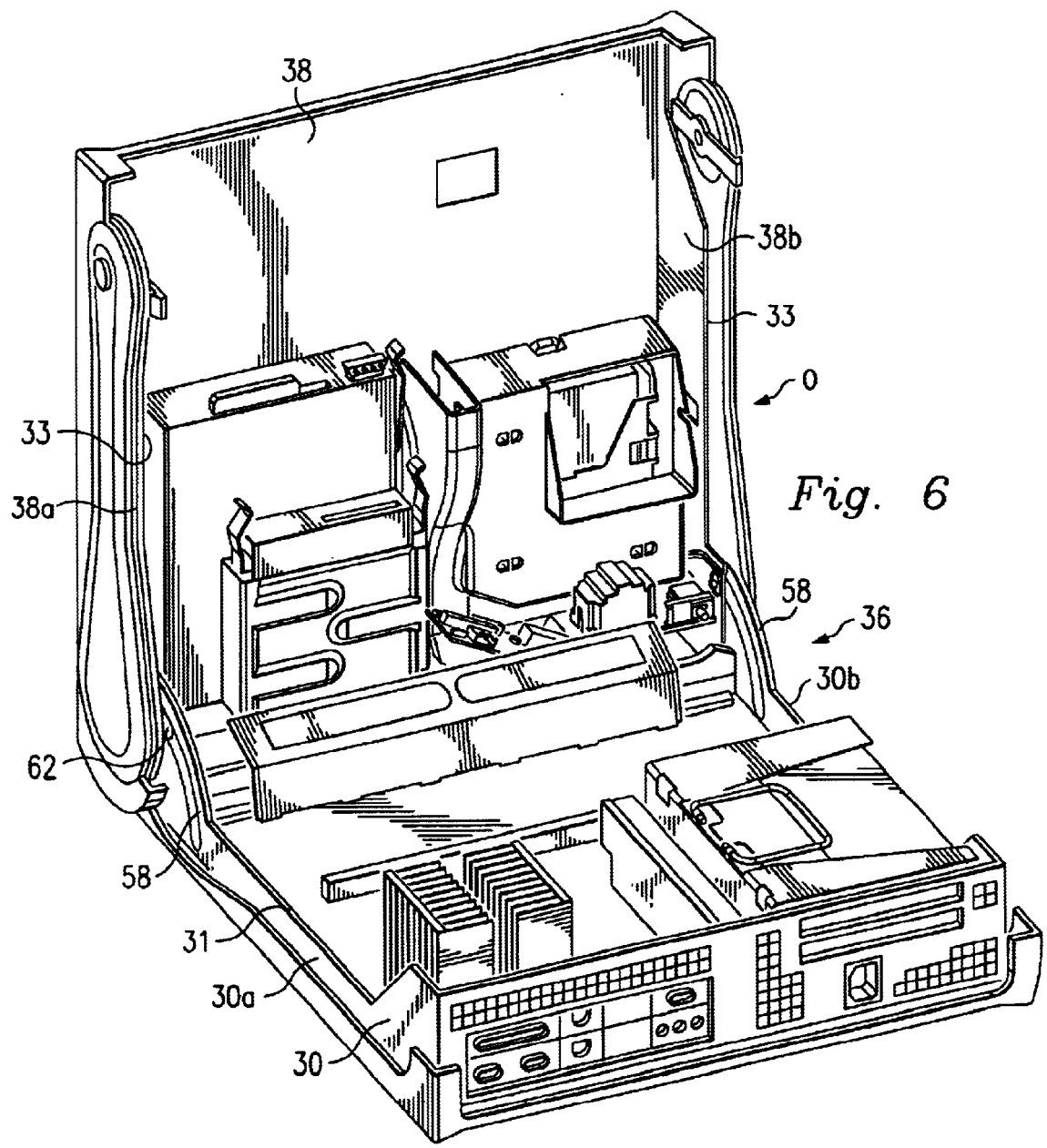
FIG. 6 is another perspective view illustrating the chassis in the open position.
Figure 7:
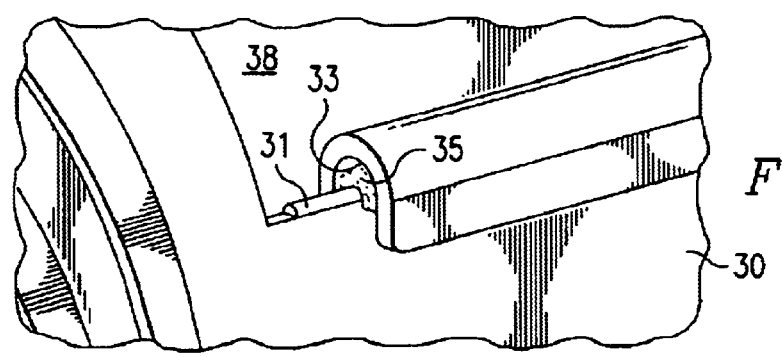
FIG. 7 is a perspective view illustrating a sealing gasket in a tongue and groove engagement of a portion of the chassis.

The metal base portion 30 includes a pair of opposed base sidewalls 30a, 30b, FIGS. 5 and 6, and the metal top portion 38 includes a pair of opposed top sidewalls 38a, 38b. The sidewalls 30a, 30b, respectively matingly engage the sidewalls 38a, 38b. Preferably, the base sidewalls 30a, 30b include a tongue 31 and the top sidewalls 38a, 38b include a groove 33, see also FIG. 7. A gasket 35 is compressed into groove 33 so that a potentially harmful adhesive may not be required to maintain the gasket 35 in place. Thus, when the tongue 31 seats in groove 33, tongue 31 is sealingly engaged with gasket 35. Gasket 35 is preferably a fabric over foam EMI gasket sold under the name Foam Tite® by Advanced Performance Materials, Inc. (APM) of St. Louis, Mo.

Figure 8:
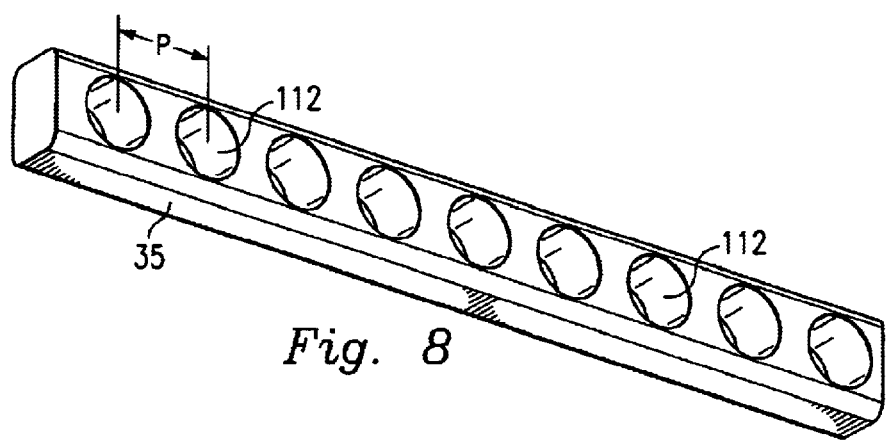
FIG. 8 is a view illustrating a gasket including a plurality of equidistantly spaced holes.
Figure 9:
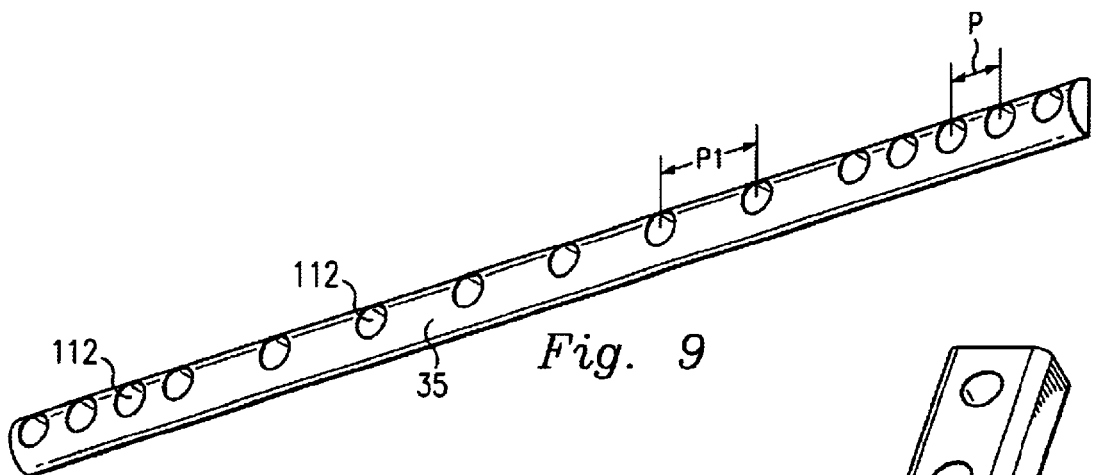
FIG. 9 is a view illustrating a gasket including a plurality of variably spaced holes.

In FIG. 8, gasket 35 includes a compressible strip of EMI limiting material such as discussed above. FIGS. 8 and 9 respectively illustrate examples of rectangular and D-shaped gaskets. A pattern of perforations such as holes 112 are formed through gasket 35.

The pitch P of holes 112, i.e. the center-to-center distance between adjacent holes 112 may be consistent or may vary along a length L of the gasket 35. FIG. 8 illustrates a consistent pitch P whereas, FIG. 9 illustrates a variable pitch P, P1, between the holes 112 to vary the compressibility of the gasket.

Figure 10:
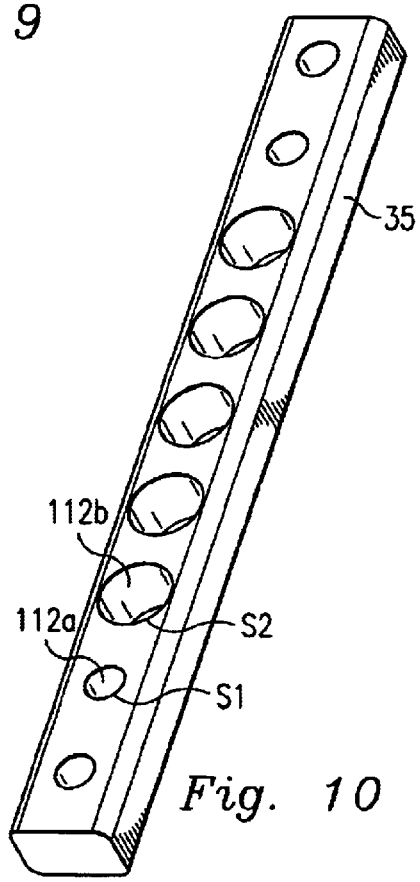
FIG. 10 is a view illustrating a gasket including a plurality of variably sized holes.

Also, FIG. 10 illustrates that compressibility can be varied by varying the size of the holes 112 as is illustrated by a plurality of holes 112a, 112b, each being of a different size such as sizes S1 and S2, respectively.

Figure 11:
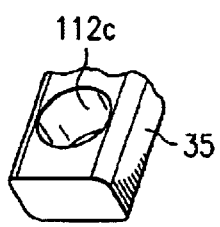
FIG. 11 is a partial view illustrating a gasket having a round hole.
Figure 12:
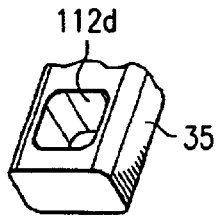
FIG. 12 is a partial view illustrating a gasket having a rectangular hole.
Figure 13:
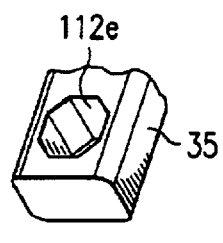
FIG. 13 is a partial view illustrating a gasket having a hexagonal hole.

In addition, the holes 112, FIGS. 11–13 can be of variable cross-sectional shapes. A hole 112c, FIG. 11, is of a circular cross-section, a hole 112d, FIG. 12, is of a rectangular cross-section, and a hole 112e, FIG. 13, is of a hexagonal cross section. A rotary die can be used to punch holes in gasket 35, as the gasket 35 is fed through the die.

The embodiments disclosed herein can be applied to any sort of continuous cross-section (D-shaped, square, C-fold, etc.) gasket material such as metalized fabric—foam core or conductive extruded elastomers. In general, any shaped hole can be put into the gasket to maximize the desired effect such as minimal forces or maximum conductivity, etc. Also, the pitch of the holes can be varied in order to match the deflection curve of the cover seams; as well as, in combination with the above variations in hole pattern.

Figure 14:
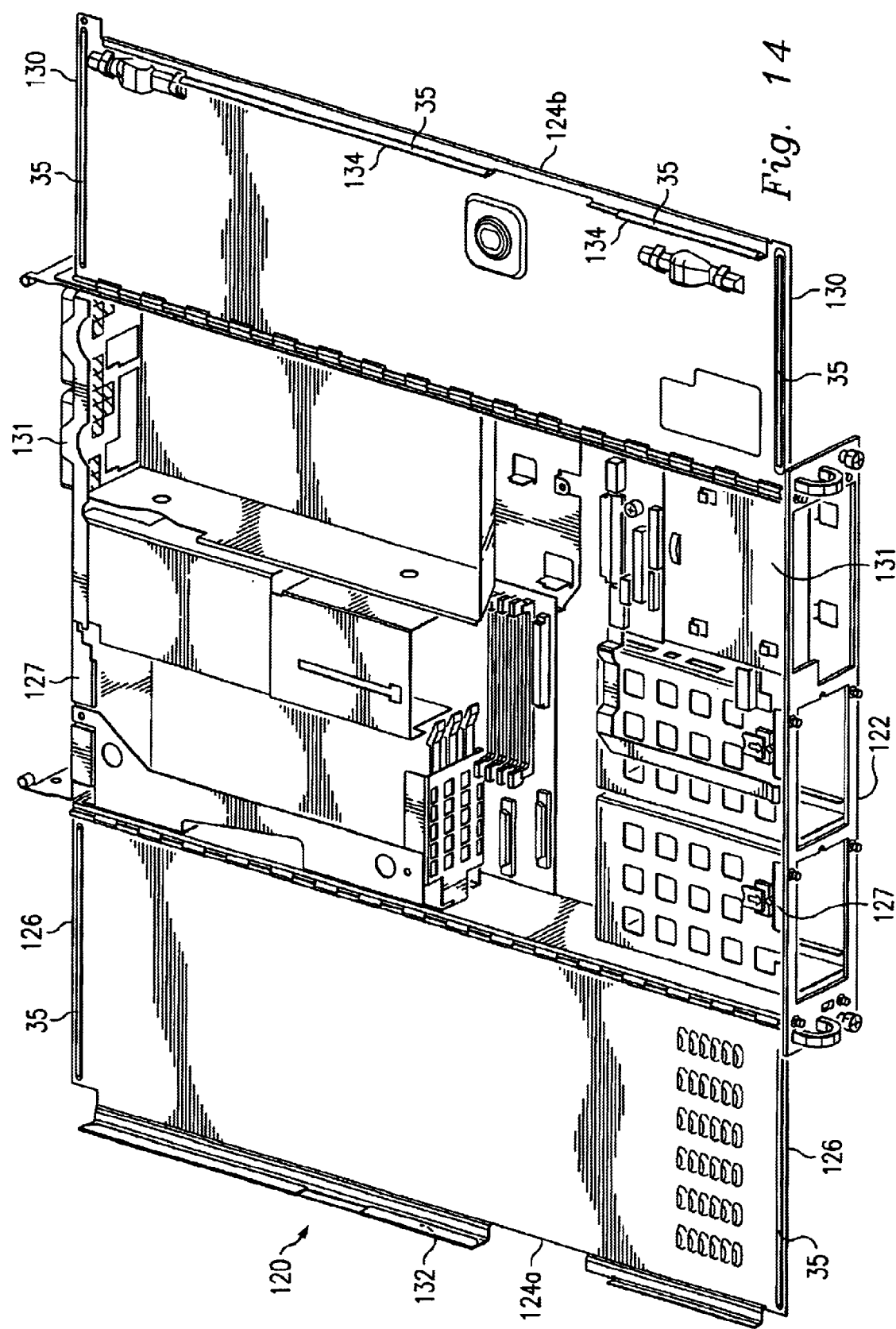
FIG. 14 is a perspective view illustrating a chassis utilizing a sealing gasket as disclosed herein.

In FIG. 14, a chassis 120 includes a chassis body 122 and a pair of chassis covers 124a, 124b which are pivotally attached to body 122. Gaskets 35 may be selectively positioned along edges 126 of cover 124a for engagement with edges 127 of chassis body 122. Also, additional gaskets 35 are selectively positioned along edges 130 of cover 124b for engagement with edges 131 of chassis body 122. In addition, gaskets 35 (not viewable in FIG. 14) are positioned along edge 132 of cover 124a and along edge 134 of cover 124b, so that these gaskets 35 engage when covers 124a and 124b are closed on the chassis body 122 such that edges 132 and 134 overlap.

Figure 15:
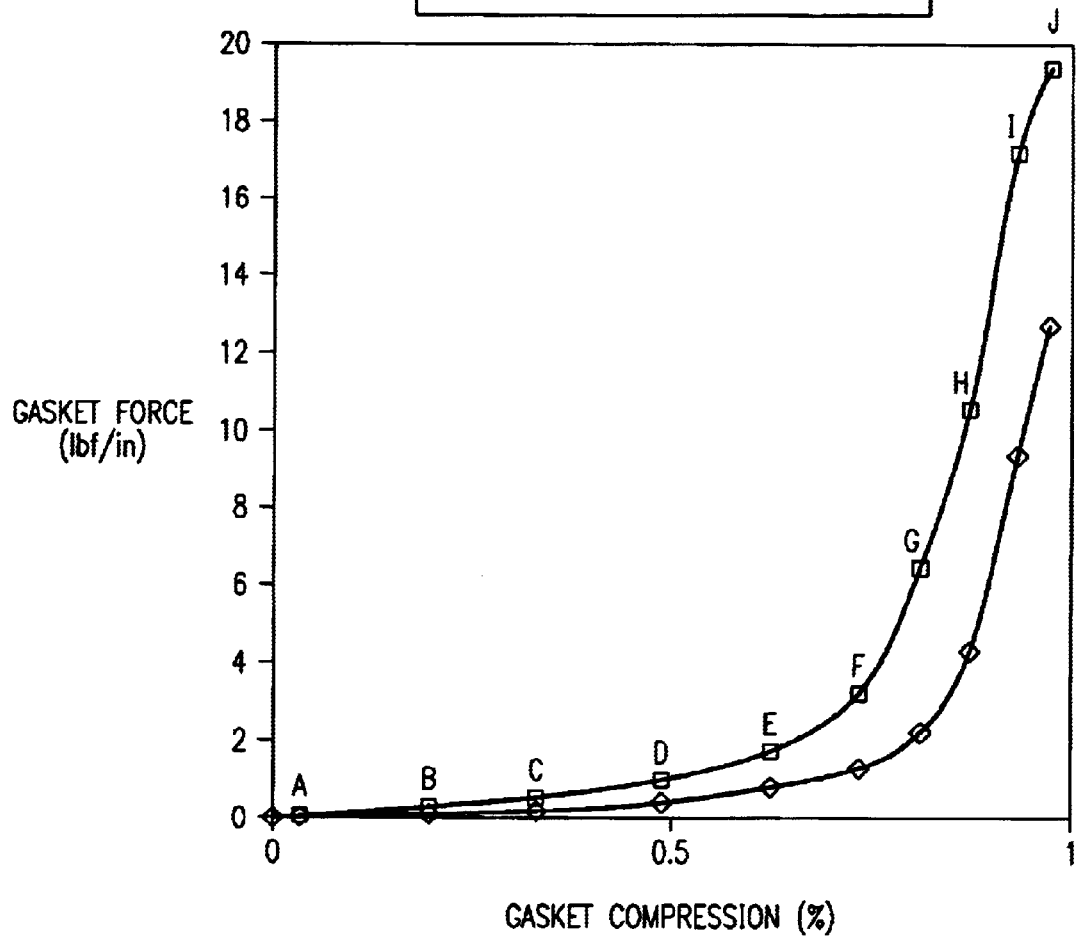
FIG. 15 is a graphical view comparing gasket compression curves.

FIG. 15 illustrates the big improvement in force/length reduction for a given gasket cross-section, when it is perforated according to the present disclosure. At point D the perforated gasket is 3 times softer than the non-perforated one. The difference in conductivity at this point is only 4.4 milliohm-Ft. The gaskets represented here are a perforated and a non-perforated 74011 gasket from Chromerics.

Figure 16:
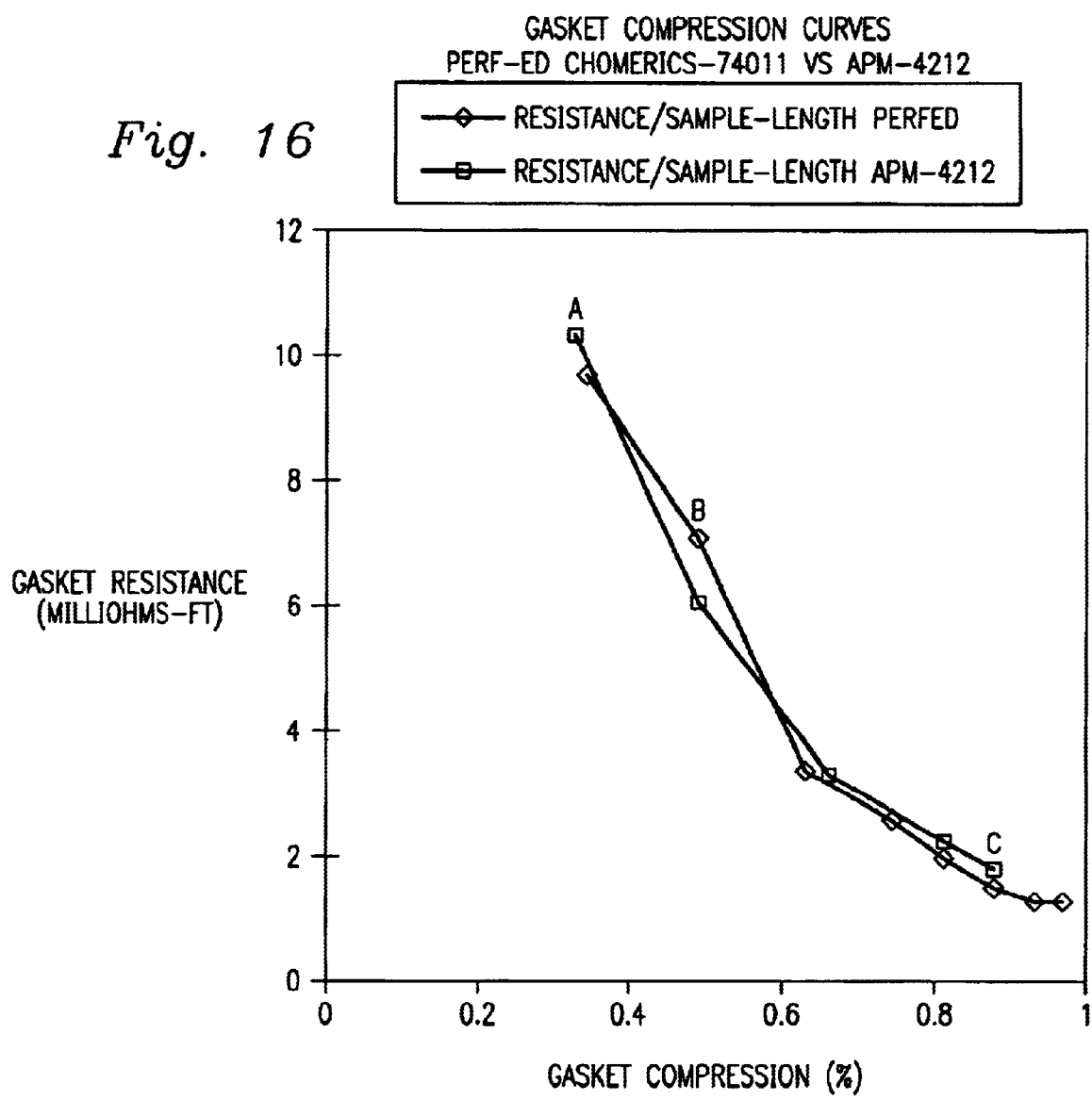
FIG. 16 is a graphical view comparing gasket compression curves.

FIG. 16 illustrates the comparison between the FIG. 15 perforated gasket and a somewhat smaller/shorter gasket. Although they both share a very similar Conductivity Vs Compression curve, the comparison of Force Vs Compression shows that the smaller (non-perforated) gasket at point B generates about 3.3 times as much force as the bigger/taller Perforated Gasket (which is 0.055" taller than the shorter gasket!). The gaskets represented here are a perforated 74011 gasket from Chromerics and a 4212 gasket from APM.

The reasons that the perforations do not adversely affect gasket performance is threefold. Firstly, the perforations allow a much larger sized (height/cross-section) gasket to be used for a given application (as stated above). Therefore the net contact area between cover and gasket may be substantially increased. Secondly, the conformability of the perforated gaskets are much better than their non-perforated counterparts along their length (as stated previously), and, in how well they flatten out. A regular non-perforated gasket will very often wrinkle or fold along it's periphery as it is compressed. This both reduces the contact area between cover and chassis, and also increases the length of the conductive path going from cover to chassis. This wrinkling/folding effect increases the contact resistance and conductive resistance of the gasket especially for rectangular cross sections. In fact, the primary (or only) reason there are D-shaped gaskets, verses rectangular, is in an attempt to produce softer more compliant gaskets. However, the D-shaped cross section generates only a small contact area in the lower range of compression (~<30%), and the conductive path is significantly longer as well. A rectangular gasket presents a larger contact throughout it's compression (and a shorter conductive path), but because of the high forces they generate, as well as the aforementioned problems, the D-shaped gaskets are often (perhaps more often) used. However, when perforated, in accordance with these embodiments, the rectangular cross sections are ideal for use in nearly all applications. Thirdly, because the type of gasket in these embodiments only conducts thru it's skin (metal plated fabric or metal foil) the contact area, along the centerline of the gasket, contributes little to the gaskets conductivity and hence can be removed without much impact, provided sufficient area is left to make conductive contact.

By removing large amounts of core material the gaskets are made much softer. These embodiments can be utilized on conductive elastomer type gaskets as well, and on various gasket cross sections. The preferred embodiment includes circular perforations with a ratio of open holes per gasket length of 0.687 (running along a centerline C of the gasket). The larger this ratio the softer the gasket. The above ratio tested to be good for ESD conductivity and EMI attenuation while vastly reducing cover forces (approximately 3 times softer).

In the event that an adhesive is used, the perforations should be formed in the gaskets prior to laminating the PSA (pressure sensitive adhesive) along the length of the gaskets. The perforations could be placed by any number of means used in standard hole punching technology, however the preferred embodiment of the hole punching method would be to use a rotary die tool which would also have continuous rotary means for applying the PSA after the hole punching.

As can be seen, the principal advantages of these embodiments are that they reduce the closure force on a metal fabric/foil wrapped foam core gasket by providing holes along the length of the gasket. The hole geometry can be varied to maximize effect. Additionally, the hole geometry can be varied along the length of the gasket to provide a variable force/compression curve to compensate for the geometry of the parts being closed by the gasket.

Additionally, the perforated gasket is much more compliant/conformable along its length compared with its non-perforated counterpart. This is in terms of maintaining continuous contact surfaces along its length over an obstacle in the chassis, or cover surfaces (screw heads, rivets, steps in sheet-metal lap joints, etc.)

The perforated gasket provides a generic form of EMI/ESD gasket with the lowest forces possible, via perforations along its length (with improved electrical/mechanical performance). That gasket also provides a means of precisely controlling the force output of an EMI gasket via varying pitch and/or size, and/or shape, of perforation holes along the length of gasket.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computer system comprising:
   a chassis having an internal computer component cavity defined therein;
   a microprocessor mounted in the chassis;
   a storage device coupled to the microprocessor;
   a first portion of the chassis formed of a metal portion;
   a second portion of the chassis formed of a metal portion;
   a plurality of computer components mounted in the first portion of the metal chassis;
   a mating edge connection between the first and second portions of the metal chassis;
   a gasket mounted in the edge connection, the gasket including a compressible strip of electro-magnetic interference (EMI) limiting material; and
   a compressive force reducing pattern of apertures formed in the strip by removal of a portion of the material from the gasket.

2. The system as defined in claim 1 wherein the apertures are equidistantly spaced apart.

3. The system as defined in claim 1 wherein the apertures are variably spaced apart.

4. The system as defined in claim 1 wherein the apertures are variably sized.

5. The system as defined in claim 1 wherein the apertures have a rectangular cross-section.

6. The system as defined in claim 1 wherein the apertures have a rectangular cross-section.

7. The system as defined in claim 1 wherein the apertures have a hexagonal cross-section.

* * * * *